US012615975B2

(12) United States Patent
Shin et al.

(10) Patent No.: US 12,615,975 B2
(45) Date of Patent: Apr. 28, 2026

(54) METHOD OF FORMING THIN FILM FOR MINIMIZING INCREASE IN DEFECTS AT INTERFACE DURING HIGH-TEMPERATURE OXIDATION PROCESS

(71) Applicant: EQ TECH PLUS CO., LTD., Suwon-si (KR)

(72) Inventors: Dong Hwa Shin, Suwon-si (KR); Yong Weon Kim, Suwon-si (KR)

(73) Assignee: EQ TECH PLUS CO., LTD., Suwon-si (KR)

( * ) Notice: Subject to any disclaimer, the term of this patent is extended or adjusted under 35 U.S.C. 154(b) by 375 days.

(21) Appl. No.: 18/224,652

(22) Filed: Jul. 21, 2023

(65) Prior Publication Data

US 2024/0249935 A1 Jul. 25, 2024

(30) Foreign Application Priority Data

Jan. 19, 2023 (KR) ........................ 10-2023-0008039

(51) Int. Cl.

*H10P 14/60* (2026.01)
*H10D 64/01* (2025.01)
*H10P 14/692* (2026.01)

(52) U.S. Cl.

CPC ......... *H10P 14/6308* (2026.01); *H10D 64/01* (2025.01); *H10D 64/01366* (2026.01); *H10P 14/6339* (2026.01); *H10P 14/6519* (2026.01); *H10P 14/69215* (2026.01)

(58) Field of Classification Search

CPC ......... H01L 21/02236; H01L 21/02164; H01L 21/0228; H01L 21/02323; H01L 21/049; H10D 64/01

See application file for complete search history.

(56) References Cited

U.S. PATENT DOCUMENTS

| | | | | |
|---|---|---|---|---|
| 10,217,811 | B1 * | 2/2019 | Shimizu ............... | H10D 64/252 |
| 2002/0172774 | A1 | 11/2002 | Lipkin | |
| 2017/0207305 | A1 * | 7/2017 | Yen ...................... | H10D 12/411 |
| 2020/0152451 | A1 | 5/2020 | Liu et al. | |

FOREIGN PATENT DOCUMENTS

| | | | | | |
|---|---|---|---|---|---|
| CN | 106340448 | A | * | 1/2017 | ....... H01L 21/02164 |
| CN | 108 584 963 | A | | 9/2018 | |
| CN | 108 666 206 | A | | 10/2018 | |
| CN | 114023633 | A | | 2/2022 | |
| CN | 115 588 612 | A | | 1/2023 | |
| JP | WO2003-047000 | | | 6/2003 | |
| JP | 2003218082 | A | * | 7/2003 | ....... H01L 21/28202 |
| JP | 2005136386 | A | | 5/2005 | |
| JP | 2006135161 | A | | 5/2006 | |
| JP | 2008243919 | A | * | 10/2008 | |

(Continued)

*Primary Examiner* — Mohammad M Choudhry

(74) *Attorney, Agent, or Firm* — Dinsmore & Shohl LLP; Yongsok Choi, Esq.

(57) ABSTRACT

Provided is a method of forming a thin film to minimize an increase in defects at an interface during a high-temperature oxidation process of a SiC substrate. The method includes depositing a first thin film on the SiC substrate by applying a radical gas, forming an oxide film on the first thin film by performing the high-temperature oxidation process, and performing annealing on the oxide film.

8 Claims, 10 Drawing Sheets

(56) References Cited

FOREIGN PATENT DOCUMENTS

| | | | | | |
|---|---|---|---|---|---|
| JP | 2019040993 | A | | 3/2019 | |
| JP | 2021192397 | A | | 12/2021 | |
| KR | 10-0920402 | B1 | | 10/2009 | |
| KR | 10-1558428 | B1 | | 10/2015 | |
| KR | 10-1900045 | B1 | | 9/2018 | |
| KR | 10-1904383 | B1 | | 10/2018 | |
| KR | 10-1934165 | B1 | | 12/2018 | |
| KR | 10-2022-0166339 | A | | 12/2022 | |
| WO | WO-2016114057 | A1 | * | 7/2016 | ........... H10D 64/252 |

* cited by examiner

NO, N₂O Anneal

| High Temp. Oxidation | ~200 |
| SiC SUBSTRATE | ~100 |

NO, N₂O Anneal

| High Temp. Oxidation | ~200 |
| Radical Oxidation or Racial ALD | ~300 |
| SiC SUBSTRATE | ~100 |

FIG. 7B

| No | Condition | $D_{IT}$ ($cm^{-2}eV^{-1}$) @0.2V |
|---|---|---|
| 1 | Thermal Ox. + NO Anneal | 3.81e11 |
| 2 | Radical Ox. + Thermal Ox. + NO Anneal | 2.66e11 |
| 3 | Radical Ox. + Thermal Ox. | 8.88e11 |
| 4 | Radical ALD + Thermal + NO Anneal | 2.85e11 |
| 5 | Radical ALD + Thermal Ox. | 1.05e12 |
| 6 | Thermal Ox. | 2.87e12 |

METHOD OF FORMING THIN FILM FOR MINIMIZING INCREASE IN DEFECTS AT INTERFACE DURING HIGH-TEMPERATURE OXIDATION PROCESS

CROSS-REFERENCE TO RELATED APPLICATION

This application is based on and claims priority under 35 U.S.C. § 119 to Korean Patent Application No. 10-2023-0008039, filed on Jan. 19, 2023, in the Korean Intellectual Property Office, the disclosure of which is incorporated by reference herein in its entirety.

BACKGROUND

The present disclosure relates to a method of forming a thin film, and more particularly, to a method of minimizing an increase in defects at an interface when a high-temperature oxidation process is performed.

Power semiconductors are generally used as switching devices for power conversion. The reliability of electrical characteristics of silicon (Si)-based power semiconductor devices has reached limitation, and accordingly, recently, research on silicon carbide (SiC) semiconductor devices of power device materials that may operate in extreme conditions, such as a high voltage, low resistance, a high frequency, and a high temperature beyond the limits of Si has been actively conducted. In this case, one of factors influencing components of power semiconductors is interface trap density of an interface between a silicon substrate and a gate oxide film.

When a gate oxide film is formed through high-temperature oxidation of SiC, carbon (C) eliminated from SiC bond maintains an incomplete bond around an interface where an oxide film is formed or forms a carbon-carbon (C—C) bond with high bonding energy.

This situation causes flat band voltage distortion and carrier mobility degradation, resulting in limitation in application of a high voltage and high current fields, and even when used within a capacitance range, device reliability problems occur due to malfunctions due to logic circuit errors.

FIG. 1 illustrates a process of forming the known gate oxide film and an atomic bonding formula.

Referring to FIG. 1, in the known high-temperature oxidation technique, an oxide film 200 is formed by simply performing annealing after simply oxidizing a SiC substrate 100 at a high temperature. The oxide film 200 of $SiO_2$ is formed by combining SiC on the SiC substrate 100 with $O_2$. In this case, carbon (C) that is unreacted, unbonded, or undischarged in an oxidation process remains at an interface between the SiC substrate 100 and the oxide film 200 as a by-product, and excess carbon (C) is again formed into a carbon cluster, such as carbon-carbon (C—C).

Specifically, when SiC and $O_2$ are combined, $SiO_2$ and carbon (C) may be generated (this may correspond to a main reaction of high-temperature oxidation). In addition, $2SiO_2$ and 2CO are generated through combination of 2SiC and $3O_2$ in the known process, and SiO and CO are generated by another combination of SiC and $O_2$, but CO and SiO are vaporized as gases, and as a result, carbon (C) remains as a by-product on an interface.

In this case, carbon (C) remaining on the interface as a by-product is formed again as a carbon (C) cluster, such as carbon-carbon (C—C), which causes defects at the interface. For example, there is a problem that the reliability of SiC high voltage and high current devices is reduced due to flat band voltage distortion and carrier mobility deterioration.

SUMMARY

The present disclosure solves the above-described problems of the related art, and an object of the present disclosure is to implement a process capable of minimizing an increase in defects at an interface during a high-temperature oxidation process for forming a thin film.

Another object of the present disclosure is to reduce defects at an interface by reducing the specific gravity of carbon (C) remaining at an interface of a thin film during a high-temperature oxidation process.

Technical objects to be achieved by the present embodiment are not limited to the technical object described above, and other technical objects may exist.

According to an aspect of the present disclosure, a method of forming a thin film to minimize an increase in defects at an interface during a high-temperature oxidation process of a SiC substrate includes depositing a first thin film on the SiC substrate by applying a radical gas, forming an oxide film on the first thin film by performing the high-temperature oxidation process, and performing annealing on the oxide film.

Also, in depositing the first thin film, the first thin film may be deposited by using any one of an ALD technique using radicals or a radical oxidation technique.

Also, the first thin film may be composed of an insulating layer of $SiO_2$.

Also, at least some of carbon-carbon (C—C) and carbon (C) of the SiC substrate, which are generated as by-products in a process of forming the insulating layer of $SiO_2$ through a chemical reaction in depositing the first thin film and forming the oxide film, may be vaporized by being combined with the radical gas.

Also, when the ALD technique using the radicals is performed, carbon (C) of the SiC substrate may be vaporized in a form of any one of $CO_2$, CH, and CO through the chemical reaction in depositing the first thin film and forming the oxide film.

Also, when the radical oxidation technique is performed, carbon (C) of the SiC substrate may be vaporized in a form of any one of $CO_2$, CO, and $CH_x$ through the chemical reaction in depositing the first thin film and forming the oxide film.

Also, in performing the annealing, the annealing may be performed with at least one of NO and $N_2O$.

Also, processes corresponding to the depositing of the first thin film and the forming of the oxide film may be performed at a process temperature between 500° C. and 750° C.

Also, processes corresponding to the depositing of the first thin film and the forming of the oxide film may be performed at a process pressure less than 5 Torr.

Also, processes corresponding to the depositing of the first thin film and the forming of the oxide film may be included in a process of forming a gate oxide film during a process of forming a semiconductor device.

BRIEF DESCRIPTION OF THE DRAWINGS

Embodiments will be more clearly understood from the following detailed description taken in conjunction with the accompanying drawings in which:

FIGS. 7A and 7B are respectively a second graph and a table illustrating a relationship between a voltage for each process and interface trap density, according to an embodiment of the present disclosure.

DETAILED DESCRIPTION

Figure 1:
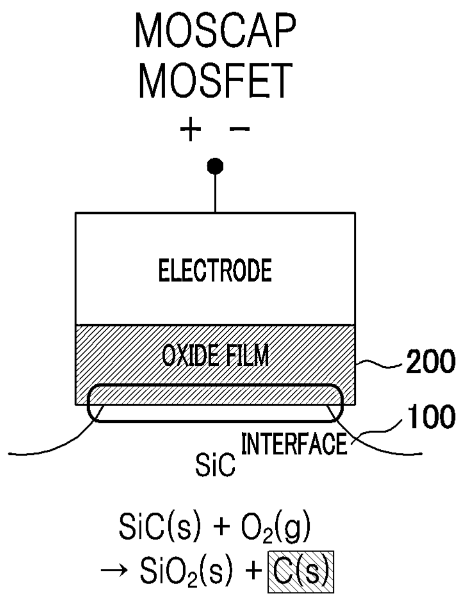
FIG. 1 illustrates a process of forming a known gate oxide film and an atomic bonding formula.

Hereinafter, embodiments of the present disclosure will be described in detail with reference to the accompanying drawings such that those skilled in the art in which the present disclosure belongs may easily practice the present disclosure. However, the present disclosure may be implemented in many different forms and is not limited to the embodiments described herein. In addition, in order to clearly describe the present disclosure, parts irrelevant to the description are omitted in the drawings, and similar reference numerals are attached to similar parts throughout the specification.

When it is described that a portion is "connected" to another portion throughout the specification, this includes not only a case where the portion is "directly connected" to another portion but also a case where the portion is "electrically connected" to another portion with another component therebetween. In addition, when it is described that a portion "includes" a certain component, this means that the portion may further include another component without excluding another component unless otherwise stated.

The following embodiments are detailed descriptions for better understanding of the present disclosure and do not limit the scope of the present disclosure. Therefore, inventions of the same scope that perform the same functions as the present disclosure will also fall within the scope of the present disclosure.

A thin film or deposition defined in the specification of the present disclosure below may indicate a process of thinly coating an oxide or a metal by alternately adsorbing and replacing molecules on a surface of a wafer (substrate) during a semiconductor manufacturing process. Accordingly, each process described in the following specification may be performed by a radical generation unit, a deposition device, and so on, and thin film formation or deposition may be implemented through technology, such as atomic layer deposition (ALD) or chemical vapor deposition (CVD).

Figure 2:
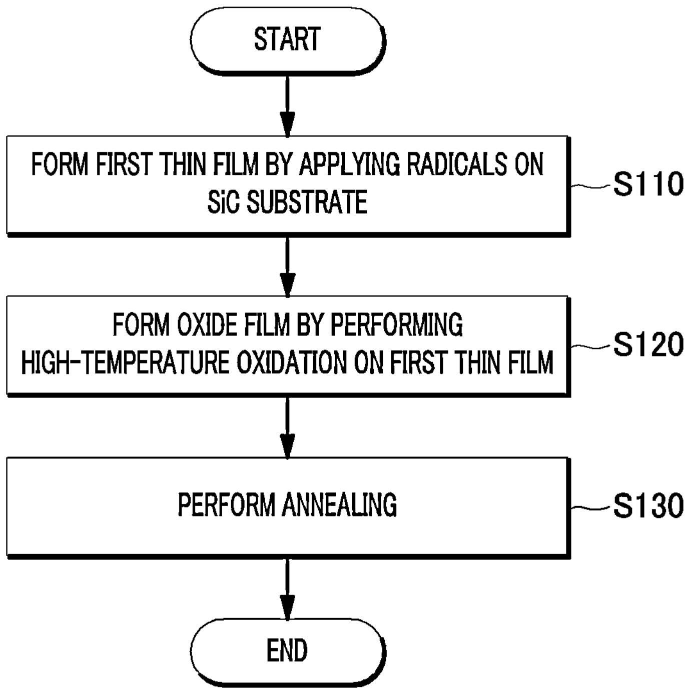
FIG. 2 is an operation flowchart illustrating a process of forming a thin film for minimizing an increase in defects at an interface during a high-temperature oxidation process of a silicon carbide (SiC) substrate, according to one embodiment of the present disclosure.

FIG. 2 is an operation flowchart illustrating a process of forming a thin film for minimizing an increase in defects at an interface during a high-temperature oxidation process of a silicon carbide (SiC) substrate, according to an embodiment of the present disclosure.

Referring to FIG. 2, a first thin film 300 (see FIG. 3B) may be formed on a SiC substrate 100 (see FIG. 3B) by applying radicals (S110).

Figure 3A:
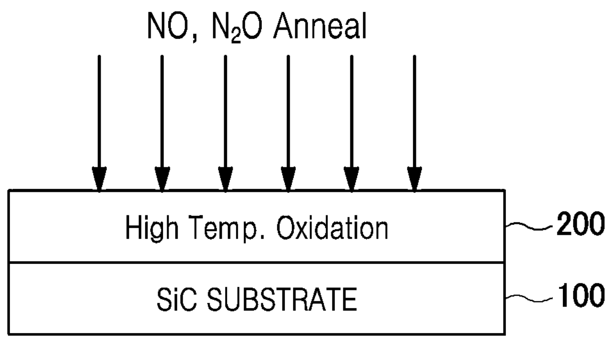
FIG. 3A is a view illustrating a shape of a thin film formed through a known high-temperature oxidation process of a SiC substrate.
Figure 3B:
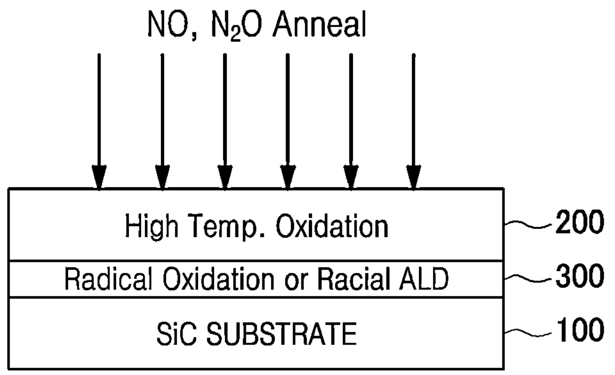
FIG. 3B is a view illustrating a shape of a thin film formed through a process of minimizing an increase in defects at an interface during a high-temperature oxidation process of a SiC substrate, according to an embodiment of the present disclosure.

The first thin film 300 may be formed on the SiC substrate 100 as illustrated in FIG. 3B through a preceding process of step S110. Here, the first thin film 300 may be composed of an insulating layer of $SiO_2$.

In this case, either ALD using radicals or radical oxidation may be selectively applied to a process of applying radicals.

Next, an oxide film 200 (see FIG. 3B) may be formed on the first thin film 300 by performing a high-temperature oxidation process (S120).

Carbon (C) of the SiC substrate 100, which is generated as a by-product during a process of forming an insulating layer of $SiO_2$ through a chemical reaction of step S120, may be vaporized by combining at least a part of the carbon with a radical gas.

In addition, the known high-temperature oxidation and annealing process requires a process temperature of 1100° C. to 1400° C. and a process pressure of 600 Torr to 750 Torr as process conditions. However, when the process described in the present specification is applied, the oxide film 200 may be formed only at a process temperature of 500° C. to 750° C. and a process pressure less than 5 Torr.

Finally, gas annealing may be performed on the oxide film 200 (S130).

As illustrated in FIG. 3A, the oxide film 200 may be formed on the thin film 300 through a final process of step S130. Here, annealing may be performed with at least one of NO or $N_2O$.

In this case, in an optional embodiment, when the ALD using radicals is performed in step S110, carbon (C) of the SiC substrate 100 may be vaporized in the form of any one of $CO_2$, CH, and CO through chemical reactions in step S120 to step S130.

In another optional embodiment, when the radical oxidation is performed in step S110, carbon (C) of the SiC substrate 100 may be vaporized in the form of any one of $CO_2$, CO, and $CH_x$ through chemical reactions in step S120 and step S130.

When this is described in detail by using a chemical formula, only two processes of high-temperature oxidation and annealing are performed on the SiC substrate 100 as the known process. Accordingly, the following three chemical reactions may be performed on the SiC substrate 100 below.

$$SiC + O_2 = SiO_2 + C\,(\text{solid}) \quad \text{Formula 1}$$

$$2\,SiC + 3\,O_2 = 2\,SiO_2 + 2\,CO \quad \text{Formula 2}$$

$$SiC + O_2 = SiO + CO \quad \text{Formula 3}$$

In this case, a main reaction of the high-temperature oxidation corresponds to Formula 1, and SiO and CO of by-products obtained as a result of the chemical reaction do not remain on a substrate because SiO and CO are vaporized, but a large amount of carbon (C) obtained by Formula 1 remains on an interface in a solid state.

In contrast to this, the process provided herein performs three processes of forming the first thin film 300 using radicals on the SiC substrate 100 and then performing high-temperature oxidation and annealing. Accordingly, five additional chemical reactions including the three reactions performed in the known processes may be performed.

Formula 4

$$SiC + 4\,OH = SiO_2 + CO_2 + 2\,H_2$$

Formula 5

$$2\,SiC + 6\,OH = 2\,SiO_2 + 2\,CO + 3\,H_2$$

Formula 6

$$SiC + HO_2 = SiO_2 + CH$$

Formula 7

$$2\,SiC + 6\,O + 4\,H \longrightarrow 2\,SiO_2 + CO_2 + CH_4$$

Formula 8

$$\text{Si Precursor} + 2\,OH = SiO_2 + \text{by-product(g)}$$

Formula 4 to Formula 8 may be chemical reactions that occur as the first thin film 300 is formed by using a radical gas prior to the high-temperature oxidation. Here, CO, $CO_2$, CH, and $CH_4$, which are by-products of the chemical reaction, are vaporized in a gaseous state and are by-products obtained by reacting with carbon (C) remaining on an interface, and accordingly, carbon (C) in a solid state which remains on an interface may be minimized compared to the known process.

Here, Formula 4, Formula 5, and Formula 8 may correspond to main reactions obtained through the ALD process using radical oxidation or radicals on an interface. As a result, the chemical reactions corresponding to Formula 4 to Formula 8 may be obtained through the process described in the present specification, and the process may have the advantage of easily removing by-products even with a low-pressure process.

Figure 4A:
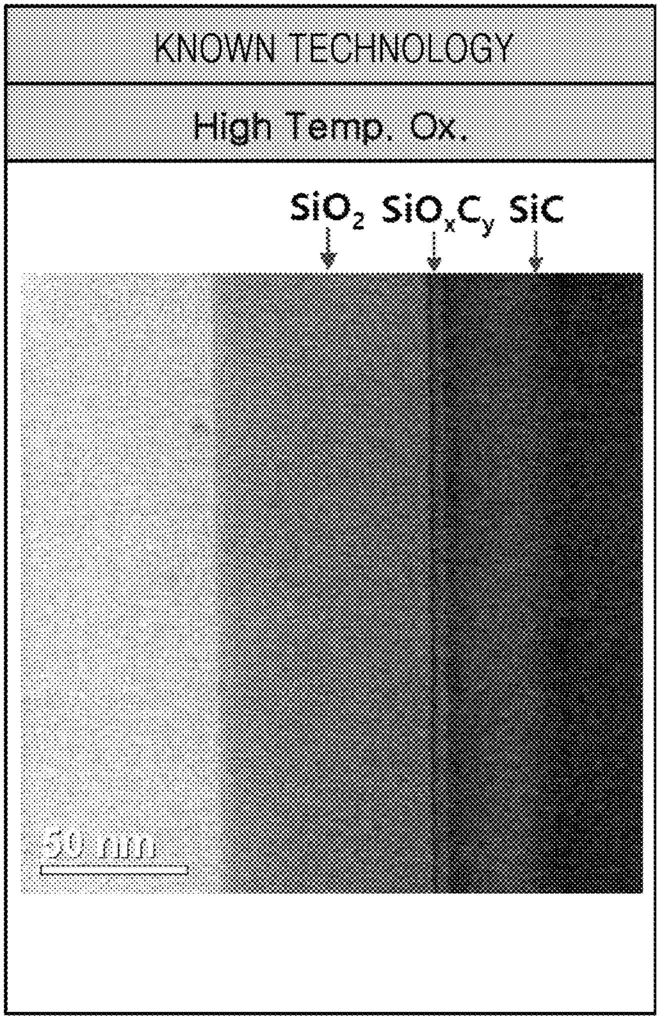
FIG. 4A is a cross-sectional view of a thin film on a SiC substrate which is formed through a known process.
Figure 4B:
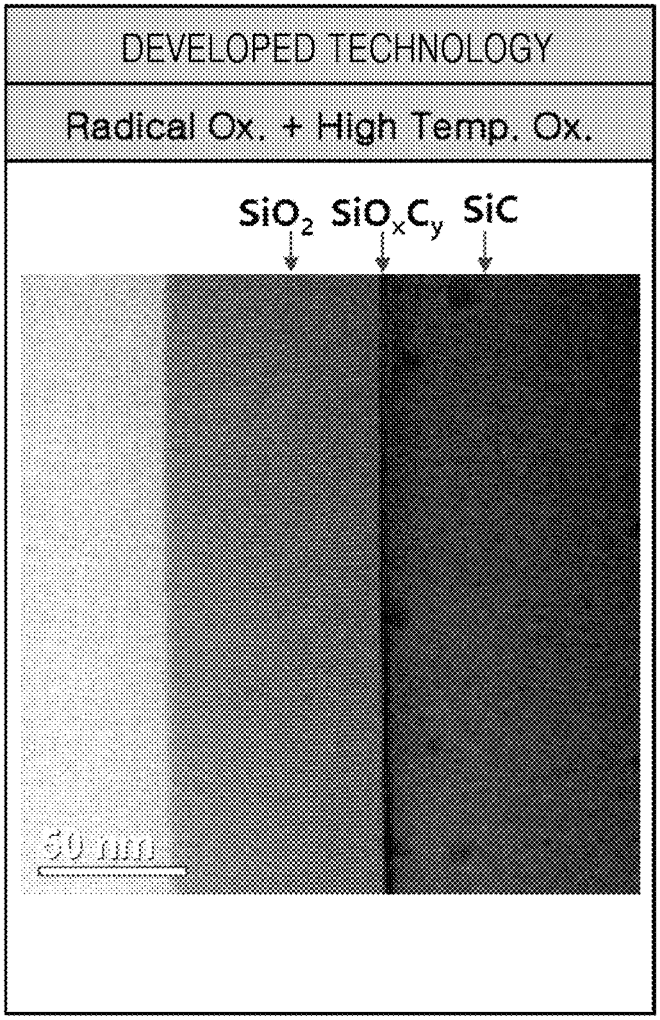
FIGS. 4B to 4C are cross-sectional views of a thin film formed on a SiC substrate, according to an embodiment of the present disclosure.
Figure 4C:
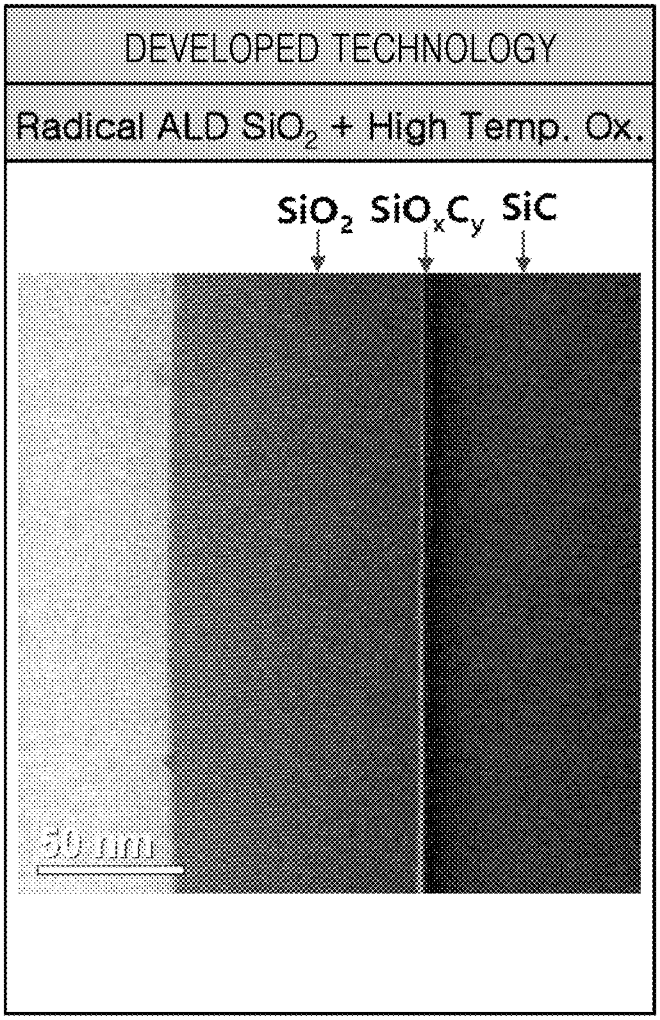

In addition, although only the SiC substrate 100 and the oxide film 200 are illustrated in FIG. 3A, a layer may be formed actually by carbon (C) remaining on an interface. In addition, although the first thin film 300 remains even in the case of FIG. 3B illustrating the process described in the present specification, elements constituting a corresponding layer are vaporized through high-temperature oxidation and annealing, and accordingly, a transition layer (SiOxCy) formed by unreacted carbon (C) remains. FIGS. 4A to 4C below illustrate actual cross-sections of thin films.

FIG. 4A is a cross-section of a thin film formed on a SiC substrate produced through the known process, and FIGS. 4B to 4C illustrate cross-sections of a thin film formed on the SiC substrate 100 according to an embodiment of the present disclosure.

FIG. 4A is a cross-section of a thin film formed through the known process, and FIGS. 4Bb and 4C may be a thin film formed through the process provided by the present specification. Here, FIG. 4B illustrates a result of applying a radical oxidation process, and FIG. 4C illustrates a result of applying an ALD process using radicals.

Thicknesses of the transition layers (SiOxCy) in FIGS. 4A to 4C are different from each other, and the thickness of the transition layer (SiOxCy) illustrated in FIG. 4A are the thickest. That is, it can be seen that a thick transition layer (SiOxCy) is formed when only high-temperature oxidation is performed on the SiC substrate 100.

In addition, as illustrated in FIGS. 4B and 4C, the first thin film 300 formed through step S110 is removed through a radical oxidation process or an ALD process using radicals.

Figure 5:
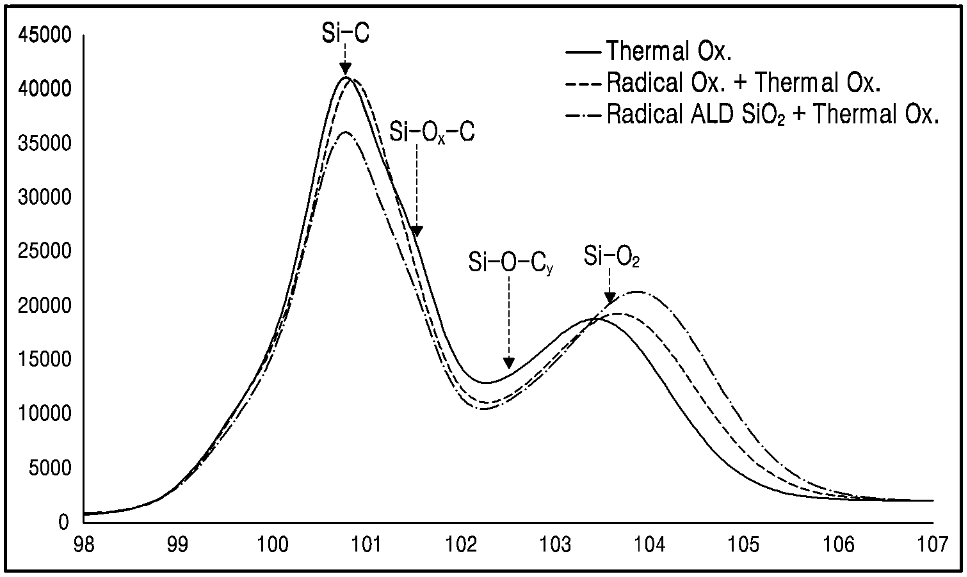
FIG. 5 is a graph illustrating a formation degree of $SiO_2$ and a transition layer (SiOxCy) according to an embodiment of the present disclosure.

FIG. 5 is a graph illustrating the degree of formation of a transition layer (SiOxCy) according to an embodiment of the present disclosure.

Referring to the graph illustrated in FIG. 5, a red line of the graph illustrates the known oxidation process, a green line illustrates a process in which both radical oxidation and high-temperature oxidation are performed together, and a blue line illustrates a process in which radical ALD and high-temperature oxidation are performed together.

Referring to the graph of FIG. 5, when the radical oxidation process or the radical ALD is performed prior to the high-temperature oxidation, intermediate state bonding of the transition layer (SiOxCy) may be less than in a process in which only high-temperature oxidation is performed.

FIG. 6A to FIG. 6F are a first graph illustrating a relationship between a voltage for each process and charge trap density, according to an embodiment of the present disclosure.

Figure 6A:
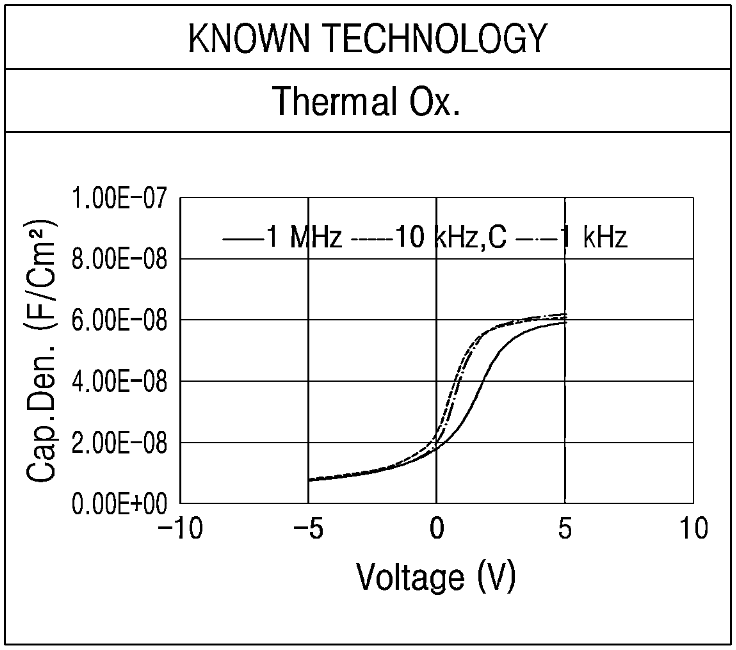
FIG. 6A to FIG. 6F are a first graph illustrating a relationship between a voltage for each process and charge trap density, according to an embodiment of the present disclosure.
Figure 6B:
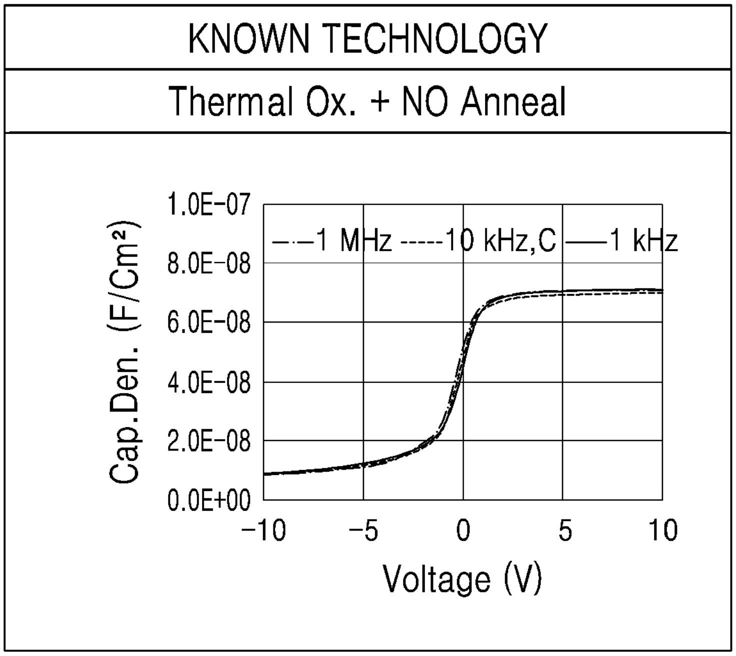

FIG. 6A and FIG. 6B illustrate the known processes, and FIG. 6C to FIG. 6F illustrate processes described in the present specification.

Prior to describing the graphs illustrated in FIG. 6A to FIG. 6F, the charge trap density of an interface may correspond to one of factors affecting characteristics of a semiconductor device.

In a process of growing the oxide film 200, which is a general process of producing a semiconductor device, Si atoms in SiC react with oxygen atoms (O), and carbon (C) atoms not reacting during a process of forming $SiO_2$ exist between the oxide film 200 and the SiC substrate 100, and accordingly, excess carbons form clusters again to form interface levels and defects. The defects act as a cause of distortion of a flat band voltage and decrease in carrier mobility, and thus, the reliability of a device is reduced.

Accordingly, a current is measured by changing a frequency of an applied voltage to obtain a capacitance-voltage curve (a c-v curve) as a method of measuring the charge trap density of an interface between the oxide film 200 and the SiC substrate 100.

Referring again to FIG. 6A to FIG. 6F, an X axis of the graph denotes a voltage value (V), an Y axis denotes a capacitance value (Cap Den; F/$cm^2$), and three lines of the graph denote a frequency (where a red line represents 1 MHZ, a yellow line represents 10 KHz, and a blue line represents 1 kHz).

It can be seen in the FIG. 6A corresponding to the known process that, when only high-temperature oxidation is applied to the SiC substrate 100, a difference between a voltage and a capacitance value is increased as the frequency increases. In addition, referring to FIG. 6B, it can be seen that the difference is not reduced completely even when high-temperature oxidation and NO gas annealing are performed on the SiC substrate 100.

Figure 6C:
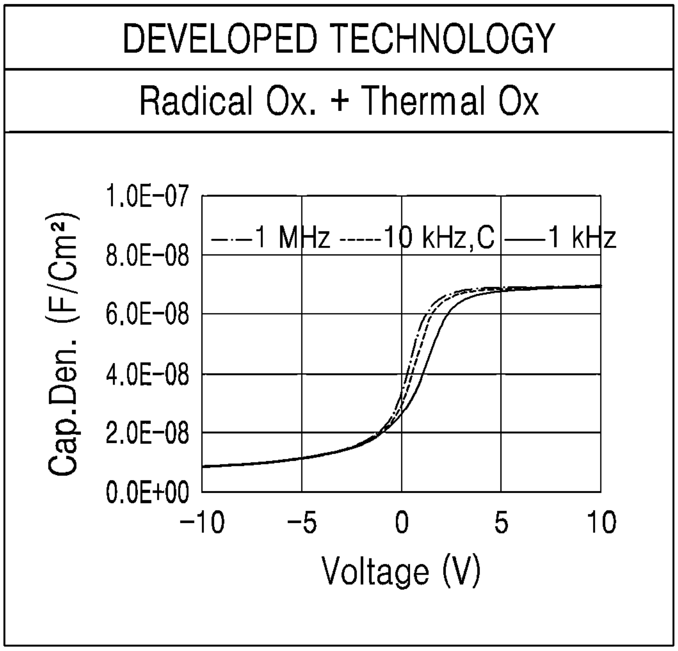
Figure 6D:
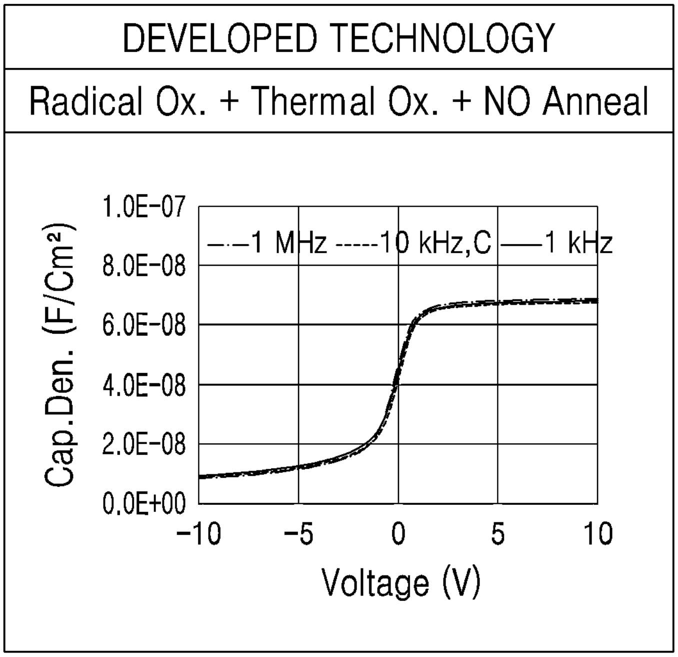
Figure 6E:
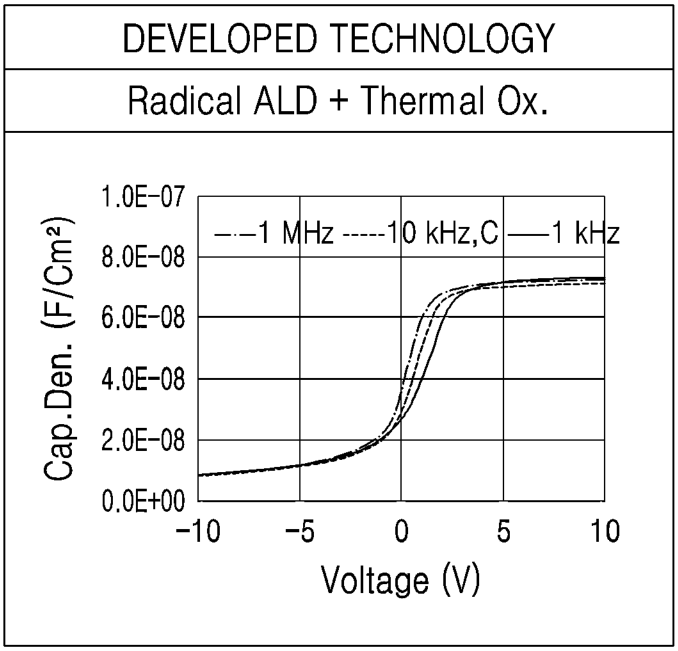

FIG. 6C and FIG. 6E corresponding to the processes described in the present specification may respectively correspond to a process in which an ALD technique using radical oxidation, high-temperature oxidation, and radicals and a process in which only high-temperature oxidation is applied. As illustrated in FIG. 6C and FIG. 6E, a difference increases between a capacitance value according to a frequency and a process in which only high-temperature oxidation is applied to the SiC substrate 100, but when an NO gas annealing process or an $N_2O$ gas annealing process is not accompanied, there may be a difference between a capacitance value and a voltage as the frequency increases.

Figure 6F:
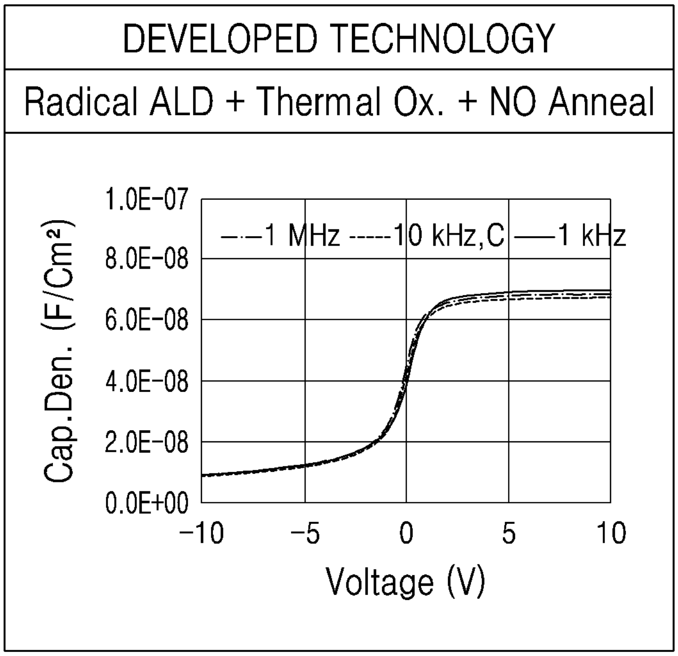

However, as illustrated in FIG. 6D and FIG. 6F, when the NO gas annealing process or the $N_2O$ gas annealing process is performed, there is little difference between the capacitance value and the voltage regardless of frequency.

That is, the known process increases in the trap density as a difference increases between an applied voltage and capacitance according to a change in frequency, but the process described in the present specification is reduced in the trap density.

Figure 7A:
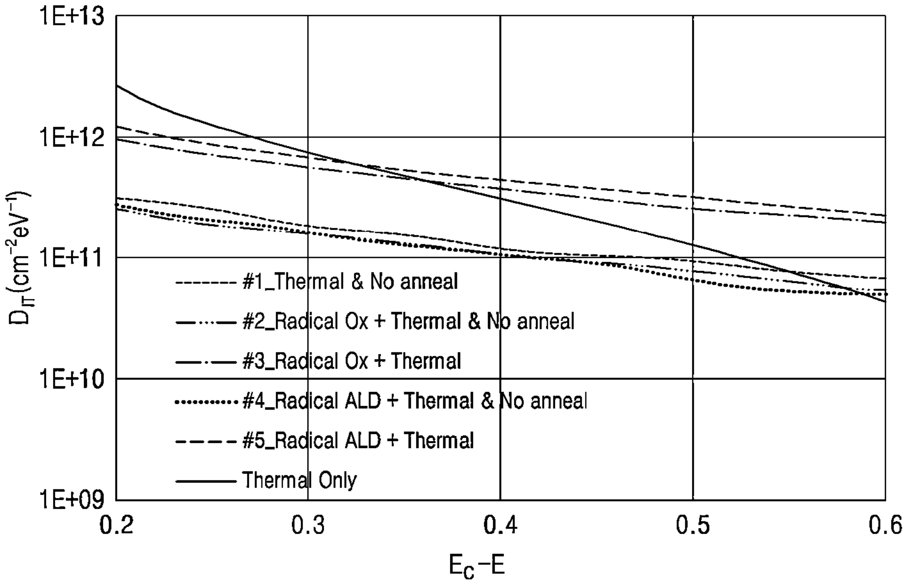

FIGS. 7A and 7B are respective a second graph and a table illustrating a relationship of interface trap density for each process according to an embodiment of the present disclosure.

Prior to describing the second graph and the table, the interface trap density $D_{it}$ relates to interface trap density calculated by a high-low method based on the first graph capacitance-voltage curve (a c-v curve) measurement described above.

In this case, the interface trap density $D_{it}$ is obtained by calculating a capacitance value for each frequency from the measured capacitance-voltage curve (a c-v curve) of FIG. 6A to FIG. 6F described above through Equation 1 below, that is, by subtracting a high-frequency capacitance value from a low frequency capacitance value.

$$D_{it} = \frac{(C_D + C_{IT})_{LF} - (C_D + C_{IT})_{HF}}{q^2 S} \approx \frac{(C_D + C_{IT})_{LF} - (C_D)_{HF}}{q^2 S} \quad \text{Equation 1}$$

In the second graph illustrated in FIG. 7A, an X axis denotes a voltage, a Y axis denotes the interface trap density $D_{it}$, and respective lines of the graph may correspond to the known process and the process described in the present specification.

In this case, referring to FIG. 7A, it can be seen that a value of the interface trap density (Dit) is reduced as a voltage increases, but a slope of a line obtained by performing only high-temperature oxidation (a gray solid line) is the highest. That is, it can be seen that, when only a high-temperature oxidation process is performed, a change in interface trap density $D_{it}$ versus voltage is the largest.

However, it can be seen that slopes of lines (a red dotted line and a blue dotted line) to which the process described in the present specification is applied is low, which indicates that a change in charge capture density according to a voltage is low, and it can be seen that the interface trap density $D_{it}$ is lower at all voltages than in the known process (a black dotted line) in which high-temperature oxidation and annealing are applied together.

This may be seen from FIG. 7B and may correspond to a table illustrating the interface trap density $D_{it}$ based on a voltage of 0.2 V for each process. In this case, it can be seen that process 2 (2.66e11 $cm^{-2}eV^{-1}$) and process 4 (2.85e11 $cm^{-2}eV^{-1}$), which are the processes described in the present specification, have a lower interface trap density $D_{it}$ value than process 1 (3.81e11 $cm^{-2}eV^{-1}$) and process 6 (2.87e12 $cm^{-2}eV^{-1}$) which are the known processes.

That is, when the high-temperature oxidation and annealing are performed after the first thin film 300 is formed by performing radical oxidation or an ALD process using radicals prior to performing high-temperature oxidation on the SiC substrate 100, it is possible to increase the interface trap density $D_{it}$ value more than the known process.

According to an embodiment of the present disclosure, it is possible to prevent an increase in defects at an interface during a high-temperature oxidation process for forming a thin film.

Defects at an interface may be reduced by reducing the specific gravity of carbon (C) remaining at an interface of a thin film during a high-temperature oxidation process. It is possible to prevent a decrease in carrier mobility of a thin film based on this, and to increase the reliability of a SiC high voltage device.

In addition, it is possible to form a thin film at a lower temperature and pressure than the known process through the process described in the present disclosure.

The above description of the present disclosure is for illustrative purposes, and those skilled in the art to which the present disclosure belongs will understand that the present disclosure may be easily modified into another specific form without changing the technical idea or essential features of the present disclosure. Therefore, the embodiments described above should be understood as illustrative in all respects and not limiting. For example, each component described as a single type may be implemented in a distributed manner, and likewise, components described as distributed may be implemented in a combined form.

The recitation of at least one of A, B and C should be interpreted as one or more of a group of elements consisting of A, B and C, and should not be interpreted as requiring at least one of each of the listed elements A, B and C, regardless of whether A, B and C are related as categories or otherwise.

The scope of the present disclosure is indicated by the following claims rather than the detailed description above, and the meaning and scope of the claims and all changes or modifications derived from the equivalent concepts should be interpreted as being included in the scope of the present disclosure.

What is claimed is:

1. A method of forming a thin film to minimize an increase in defects at an interface during a high-temperature oxidation process of a SiC substrate, the method comprising:

depositing a first thin film on the SiC substrate by applying a OH radical gas, wherein the first thin film is composed of an insulating layer of $SiO_2$;

forming an oxide film on the first thin film by performing the high-temperature oxidation process; and performing annealing on the oxide film, wherein the step of depositing the first thin film is performed before the step of the forming an oxide film and the step of the performing annealing, and in the step of depositing the first thin film, the radical gas comprised of OH radicals generates by-products which react with at least some of carbons in the SIC substrate and are vaporized.

2. The method of claim 1, wherein, in depositing the first thin film, the first thin film is deposited by using any one of an atomic layer deposition (ALD) technique using radicals or a radical oxidation technique.

3. The method of claim 1, wherein, when an ALD technique using radicals is performed, carbon (C) of the SiC substrate is vaporized in a form of any one of $CO_2$, CH, and CO through a chemical reaction in depositing the first thin film and forming the oxide film.

4. The method of claim 1, wherein, when a radical oxidation technique is performed, carbon (C) of the SiC substrate is vaporized in a form of any one of $CO_2$, CO, and $CH_x$ through a chemical reaction in depositing the first thin film and forming the oxide film.

5. The method of claim 1, wherein, in performing the annealing, the annealing is performed with at least one of NO and $N_2O$.

6. The method of claim 1, wherein processes corresponding to the depositing of the first thin film and the forming of the oxide film are performed at a process temperature between 500° C. and 750° C.

7. The method of claim 1, wherein processes corresponding to the depositing of the first thin film and the forming of the oxide film are performed at a process pressure less than 5 Torr.

8. The method of claim 1, wherein processes corresponding to the depositing of the first thin film and the forming of the oxide film are included in a process of forming a gate oxide film during a process of forming a semiconductor device.

* * * * *